United States Patent [19]
Morris et al.

[11] Patent Number: 5,932,496
[45] Date of Patent: Aug. 3, 1999

[54] COMPOSITE MATERIALS

[75] Inventors: George W Morris; Andrew S Treen; Ian Grant, all of Farnborough, United Kingdom

[73] Assignee: The Secretary of State for Defence in Her Britannic Majesty's Government of the United Kingdom of Great Britain and Northern Ireland, Hampshire, United Kingdom

[21] Appl. No.: 08/952,346

[22] PCT Filed: May 20, 1996

[86] PCT No.: PCT/GB96/01213

§ 371 Date: Nov. 18, 1997

§ 102(e) Date: Nov. 18, 1997

[87] PCT Pub. No.: WO96/38025

PCT Pub. Date: Nov. 28, 1996

[30] Foreign Application Priority Data

May 26, 1995 [GB] United Kingdom .................... 9510730
Feb. 22, 1996 [GB] United Kingdom .................... 9603806

[51] Int. Cl.⁶ ............................... B32B 15/14; C25D 5/02
[52] U.S. Cl. ......................... 442/238; 442/228; 442/229; 442/230; 442/231; 205/114; 205/125; 427/437
[58] Field of Search ................................. 442/231, 238, 442/228, 229, 230, 110; 205/114, 125, 126; 427/437

[56] References Cited

U.S. PATENT DOCUMENTS

| | | | |
|---|---|---|---|
| 2,806,509 | 9/1957 | Bozzacco et al. | 442/238 |
| 3,053,929 | 5/1962 | Friedman . | |
| 4,201,825 | 5/1980 | Ebneth | 442/231 |
| 4,882,089 | 11/1989 | Iwaskow et al. | 442/229 |
| 5,681,441 | 10/1997 | Svendsen et al. | 205/114 |

FOREIGN PATENT DOCUMENTS

| | | |
|---|---|---|
| 31 16348 AL | 9/1982 | Germany . |
| 738575 | 10/1995 | United Kingdom . |

*Primary Examiner*—Daniel Zirker
*Attorney, Agent, or Firm*—Nixon & Vanderhye P.C.

[57] ABSTRACT

A laminated composite material having patterned conductors integral to its structure made of several cloth layers and a penetrating resin matrix material in which at least one of the cloth layers has a deposited patterned layer of electrical conductor to form a conducting path in the resultant composite material. The electrical conductor is preferably deposited to such a thickness that individual fibers of the cloth are coated but that the resin permeates between individual fibers in the conducting regions. The conducting regions provide for external connection of embedded electronic devices.

12 Claims, 6 Drawing Sheets

COMPOSITE MATERIALS

The invention relates to composite materials having patterned conductors integral to their structure, and to composite materials comprising embedded electronic devices utilizing such patterned conductors.

In many modern structures use is made of fibre polymeric matrix composite materials and in particular fibre resin composite materials. These are frequently fabricated from one or more cloth layers of a fibre, such as glass or carbon fibres, formed into a woven fabric or a mat, together with some permeating polymeric matrix. Considerable potential utility has been seen in the embedding electronic devices within such materials. Such devices might include strain gauges, temperature sensors and similar sensing devices, embedded identification tags, and also aerials and the like.

Problems are encountered however in effecting electrical contact between embedded devices and the outside world. Structures are known which employ fine conductors such as thin wires which trail through the laminate to an edge. Such connections present potential points of weakness at the conductor matrix interface, which is prone to separation, have a tendency to break easily during fabrication, and only allow a connection to be made at an edge of the composite laminate. The wires take an essentially arbitrary path which allows the possibility of short-circuits in multiwire systems. The position of wires at the edge of the panel is also difficult to control, making the use of multi plug connectors virtually impossible. A further problem in that has been encountered is that the wires tend to break at the edge of the panel during autoclaving. It is clear that the trailed wire technique has limited application to embedded devices.

In more conventional situations multiple electronic devices are mounted on a printed circuit board, a board coated with a patterned layer of electrical conductor, which much simplifies the task of connecting a large number of devices. The principle can be applied to produce printed circuits either on rigid substrates or in a flexible form by coating the conductor layer onto a thin polymeric substrate. Neither type of conventional printed circuit board, however, is readily suitable for incorporation into laminated composites as they would represent a significant plane of weakness in the composite structure exhibiting a tendency to delamination at the interface with the resin matrix. Printed circuits comprising a conductive pattern on reticulated or foraminous bases are known from, for example, U.S. Pat. No. 3,053,929, but the conducting strip so formed in the conducting regions of the pattern remains a potential zone of weakness producing a tendency to delamination.

It is an object of the invention to provide a composite material incorporating a connection system with the case of connection and use of printed circuits which is more compatible with use in laminated composites.

According to an aspect of the invention there is provided a composite prepreg comprising a cloth layer formed from fibres of a material suitable for incorporation into a fibre and polymeric matrix composite having deposited thereon a patterned layer of electrical conductor, the electrical conductor being deposited to such a thickness that individual fibres of the cloth are coated but that permeation of the cloth by resin remains possible in the conducting regions, and the cloth being impregnated with an uncured, curable polymeric composite matrix material.

The invention enables complex patterns of conductors, analogous to those which can be produced on printed circuit boards, to be laid down onto the cloth allowing ready connection of a plurality of devices in a format which is suitable for incorporation into a resin matrix composite. Such complex and precisely ordered patterns could not practicably be incorporated using wires.

The cloth material may comprise woven or laid fibres or an otherwise partially porous web-like structure, provided that it is susceptible to penetration by matrix material. Since matrix material is able to penetrate between the fibres of the cloth in the unpatterned areas during composite production, the tendency to delamination at the cloth layer is limited and the material retains good through thickness strength which could not be obtained by incorporating conventional printed circuits. Better integrity and even lower tendency to delamination when the cloth is incorporated into a composite material is obtained because conducting material in the conducting regions of the pattern is laid down to a thickness where a consistent coating of the individual cloth fibres, and thus a conduction path, is produced but a solid conducting strip is not formed and the cloth in the conducting regions of the pattern remains at least partly an open mesh which will allow penetration of a matrix material between the fibres. The electrical conductor is thus deposited to such a thickness that individual fibres of the cloth are coated but that permeation of the cloth by the resin remains possible in the conducting regions. The resin is then able to penetrate between the fiber during composite production, so that the conduction paths become integral to the structure and their tendency to provide delamination sites is reduced.

Applying metal to a preformed cloth layer, rather than attempting to weave conductors into a cloth layer, ensures that adjacent fibres are provided with consistent, continuous metal coatings in the conducting region. This ensures that each fibre is connected to those surrounding it by a multitude of different pathways, and minimizes the risk of short circuits occurring in the region of a patterned track. This improved reality allows thinner tracks and obviates the need for redundant tracks, so that thinner, higher density conducting tracks can be produced allowing for the embedding of complex, multiply-connected devices such as microprocessors.

According to a further aspect of the invention there is provided a laminated composite material comprising a plurality of cloth layers and a penetrating polymeric matrix material, such as a resin matrix material, wherein at least one of the cloth layers has deposited thereon a patterned layer of electrical conductor, the electrical conductor being deposited to such a thickness that individual fibres of the cloth are coated but that the matrix material permeates therebetween.

This produces a composite panel having integral conductors with all the advantages of complexity and structural integrity described above. In addition, connection can be made at any point in a conductor path via a hole through the other layers and is not restricted to an edge of the laminate as is the case where wires are used.

The invention is particularly applicable to laminated multilayer cloth and polymeric matrix composite materials, and in particular resin matrix composite materials, in which a conductive layer is laid down in accordance with the invention onto one or more of the cloth layers. It will be understood however that the invention is not restricted to such materials but encompasses composite materials wherein at least one conducting cloth layer is incorporated into a polymeric matrix, with or without further reinforcing materials in the polymeric matrix of cloth, fibrous or other form, and whether in isolation or in combination with further known components selected for their structural or other properties.

The invention provides conducting paths which may be used in connection with one or more embedded electronic devices electrically connected to the patterned layer to effect external electrical connection to and internal connection between the embedded devices. Examples of devices which can usefully be incorporated into the laminate include sensors such as strain gauges and actuators such as shape modifiers. The invention also allows devices such as aerials, resonant structures and frequency filters to be formed directly by selecting an appropriate pattern for the conducting material. The invention is also useful in the formation of devices to monitor the degradation of the matrix material, for example by building into the structure capacitive devices which are capable of detecting alteration in the dielectric behavior of the matrix material, such as could be caused by mechanical loading, water absorption etc. within the composite. Patterns can be selected for properties other than electrical resistivity, for example to give the resulting laminate particular magnetic properties.

Furthermore, the conducting paths may be used to form inductive or other similar structures capable of interacting with suitably tuned systems external to the laminate. In this embodiment a laminated composite material is formed in which at least some of the conducting paths are configured to form one or more resonant structures suitable for effecting remote connection between an embedded device and a suitably tuned system external to the laminate. In combination with embedded devices it would then be possible to dispense with direct connections altogether and enable the devices to be inductively coupled to the outside world, further limiting the likelihood of mechanical degradation and mechanical weakness arising from inclusion of the cloth layer.

A particular application of this coupling lies in the use of embedded identification devices. An identification chip may be incorporated into the panel and provided with a suitable coupling to allow interrogation for identification purposes. Since the chip is embedded and isolated it is largely tamper proof. Such ready interrogation of panels will be useful in constructing or surveying large structures.

A particular application of the laminate is in production of smart tuneable electromagnetic corner reflectors especially for use with enhanced vision system (EVS) by civil aircraft.

In radar practice it is well known to employ corner reflectors comprising two or three flat plate reflectors (referred to as dihedral or trihedral reflectors respectively). By maintaining an orthogonal relationship between the plates, reflection in the reverse direction to incidence is achieved at a wide range of angles of incidence. The return corresponds to the main specular lobes for the individual plates, so that a high profile return reflection is provided from a range of directions for applications where enhanced radar cross section is required such as detection beacons on shipping (see for example "Radar Cross Section". Knott, Shaeffer and Tuley, Artech House Inc 1985, pp 175–177).

The diffraction effects discussed above require that the angles between the plates are maintained close to 90° to maintain reflectivity. Considering, for example, a dihedral reflector with the angle between the plates increased to $\pi/2+\delta$, where $\delta$ is small. Geometrical optics dictates that the direction of the reflected beam will differ from the reverse of the incident beam by $2\delta$. Should this discrepancy exactly match the half width of the reflected lobe, the observer at the incident source will be situated in a null. Further opening out will move him into the first side-lobe and there will be an alternation of nulls and diminishing peaks as $\delta$ is increased.

Thus the effectiveness of the dihedral depends fundamentally on the interplay of the angular error $\delta$ and the semi lobe width of order $2\lambda/d$. The physical principle of the trihedral is the same as for the dihedral and a similar working parameter can be used.

An analysis of bistatic scattering from flat plates coupled with reflections at a distorted dihedral shows that for symmetrical incidence nulls occur at $\delta=(X/\sqrt{2})(\lambda/d)$ for integer values of X. Thus small deviations from the orthogonal can produce rapid decrease in reflection, especially at the millimetric end of the RF range: for example with a not untypical 100 mm dihedral at 94 GHz the reflection profile will reduce to a first null at 1.30°. To maintain the large reflection profile which corner reflectors are designed to provide angels must closely approximate to orthogonal.

The embodiment of the invention applies this feature of scattering behaviour to produce a corner reflector comprising at least two flat reflector plates, each comprising a composite material as hereinbefore described providing electrical connection to at least one actuator, the at least one actuator comprises means capable of varying the internal angle between the reflector plates between a first angle at which the reflectance of electromagnetic radiation is substantially at a peak and a second angle at which the reflectance of electromagnetic radiation is substantially at a null.

Appropriate angles for peak and null reflectance are selected dependent on incident radiation wavelength and plate dimensions as discussed above. The reflector can then be in effect switched on and off to a particular frequency of incident radiation by use of the actuation means to switch from the configuration where reflectance is at a local maximum and a large response signal is obtained to the configuration where reflectance is at a local minimum and a much smaller response signal is produced. It is desirable to maximize the difference between the peak and the null reflectances, and to achieve this the first angle is preferably set substantially to 90° to utilize the broad maximum in reflectance cross section obtained from orthogonally arranged plates. The second angle is then conveniently selected to be at a deviation from 90° which corresponds to the first null in reflectance.

There actuator preferably comprises an actuator material which exhibits a strain response to an electrical actuation signal transmitted through the conducting laminate, such as is shown by magnetostrictive or electrostrictive ceramics and piezoelectric materials. Use of a laminate in accordance with the invention enables the actuator material to be incorporated integrally into a composite laminate reflector plate, obviating the need for external moving parts.

Of these materials the magnetostrictive materials are unlikely to be preferred for most applications of the invention due to their restrictive size. For these reasons, electrostrictive and piezoelectric materials are likely to be preferred choices for the actuator material. Electrostrictive materials can produce more useable strain than piezoelectric materials (500 $\mu\epsilon$ compared with 350 $\mu\epsilon$) and demonstrate a reduction in hysteresis. However, they show a distinct variation in performance with temperature. This last point could be overcome with sensitive strain monitoring techniques and closed loop control. Nevertheless, for simplicity of operation the most preferred actuator material will be a piezoelectric material such as PZT. This can produce an acceptable maximum strain of 350 $\mu\epsilon$ with good bandwidth performance and demonstrates a relatively good tolerance to variations in temperature. However, it is susceptible to creep and shows a higher level of hysteresis.

For accurate control of the active plates creating the corner reflector some form of strain monitoring system will be required. This will allow such effects as actuator hysteresis and creep to be compensated for with time. Many different types of strain sensors are available. For integration into the composite plates preferred options include PVDF polymer, fibre optic cables or simply a resistance strain gauge. Again, the conducting paths in the cloth allow direct connection to embedded devices within a composite panel.

A number of suitable methods can be used for laying down intricate patterned conductors onto the cloth. Patterns may simply be screen printed with conducting inks such as silver loaded inks. Alternatively, electroless and/or electrochemical deposition processes may be coupled with a suitable patterning. A possible approach involves a photolithographic patterning technique in which first coating a uniformly premetallized cloth is first coated with a photoresist which is exposed in the desired pattern and developed to reveal the metallization in the patterned areas, then thickening up the metallization in the patterned areas for example by electrodepositing further metal, and finally stripping clear the remaining photoresist and giving the cloth a further etch sufficient to remove the metallization in the unpatterned areas leaving a patterned conducting layer corresponding to the thickened areas. In a modification to this approach an appropriate pattern is printed onto a premetallized substrate by screen printing with a non-conductive ink, such as common printers ink. Once dry, the ink can serve the same purpose as the photoresist in the previous example.

The invention will now be described by way of example, with reference to the accompanying drawings in which.

The patterned cloth in the examples of FIGS. 1 to 5 is prepared via a process based on photolithographic patterning. Woven polyester cloth is first metallised by an electroless chemical deposition process, which is a well established technique for producing commercially available metallised cloth having a covering of copper, copper on nickel, iron, gold, silver, and other metals susceptible of deposition in this fashion. In the examples prepared here the technique is used to put down an essentially uniform layer of copper or of copper on nickel.

The metallised cloth is coated with a photoresist, resistant to chemical attack, which is photolithographically patterned with the desired pattern by selective exposure to ultraviolet light and immersion in an alkali developer solution in such a way as to reveal only those areas of the metallized cloth which it is intended will ultimately carry the desired metallised pattern. The metal coating of these areas is then thickened by electrodeposition of further copper. After this the remaining photoresist is wholly removed by immersion in an organic stripping solution, and the cloth subjected to a light etch in ferric chloride or ammonium persulphate which removes the unthickened metallization completely but leaves metallization in the thickened patterned regions. To produce the optimum integral strength when the cloth is incorporated into a composite material the process of thickening by electrodeposition is carefully controlled to ensure that metal is laid to an appropriate thickness so that after the light etch a consistent coating of the individual cloth fibres is produced but the conducting regions of the pattern remain penetrable by a matrix resin.

Figure 1:
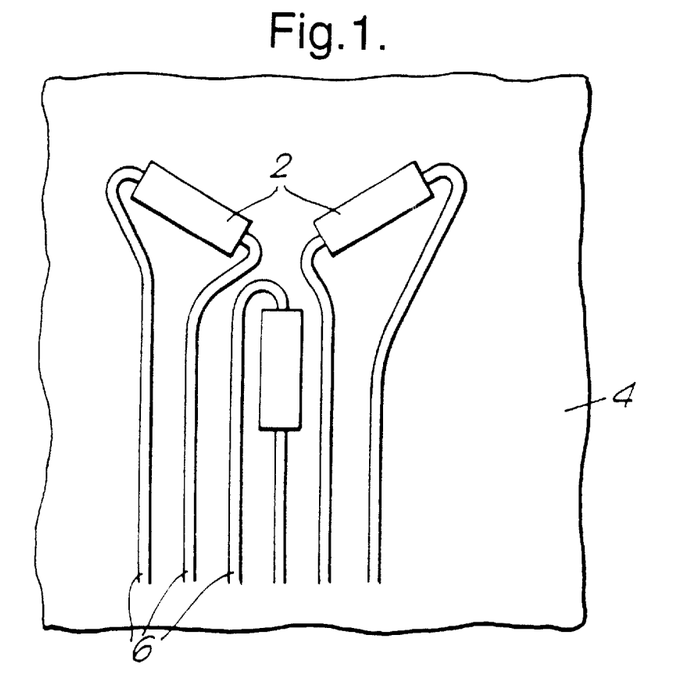
FIGS. 1 and 2 illustrate a laminated composite panel incorporating strain gauges within the composite and electrical connections formed using patterned cloth according to the invention.

FIG. 1 illustrates the cloth after this treatment. Strip resistance strain gauges 2 are located in a standard 120° array on the cloth 4 to give optimum strain measurement capability in two dimensions. A pattern of conducting paths 6 is laid out using the above described method to provide electrical connection to the strain gauges.

Figure 2:
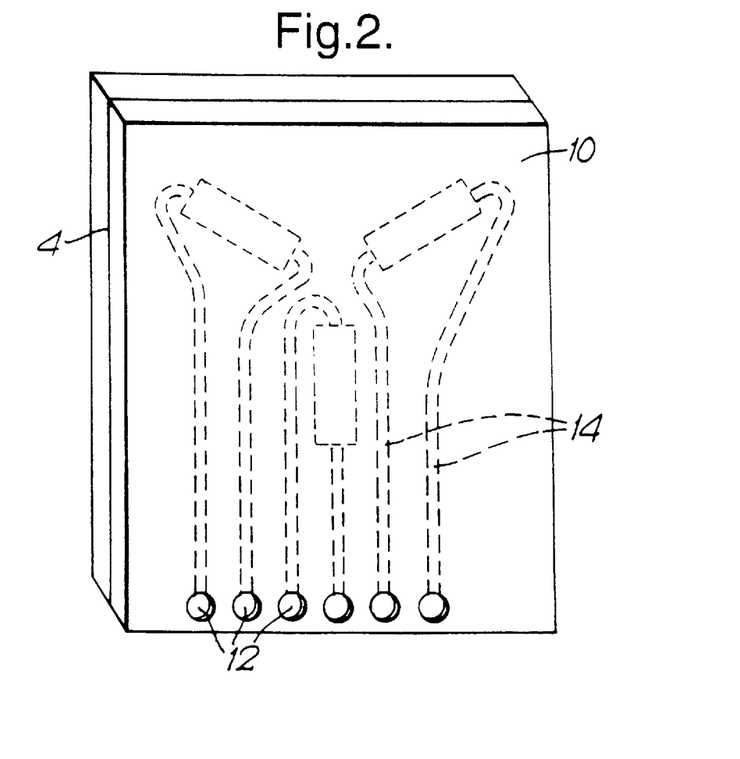

FIG. 2 shows the cloth 4 is incorporated into a multilayer laminated composite panel 10 comprising further layers of woven polyester cloth in an epoxy resin matrix, as is illustrated in FIG. 2. Holes 12 are drilled through the material to the conductors, whose path is illustrated by the broken lines 14. External connection to the strain gauge array can then be made through the holes 12, obviating the need which arises with wire conductors to make connection at the edge of the composite panel 10.

Figures 3, 4, 5:
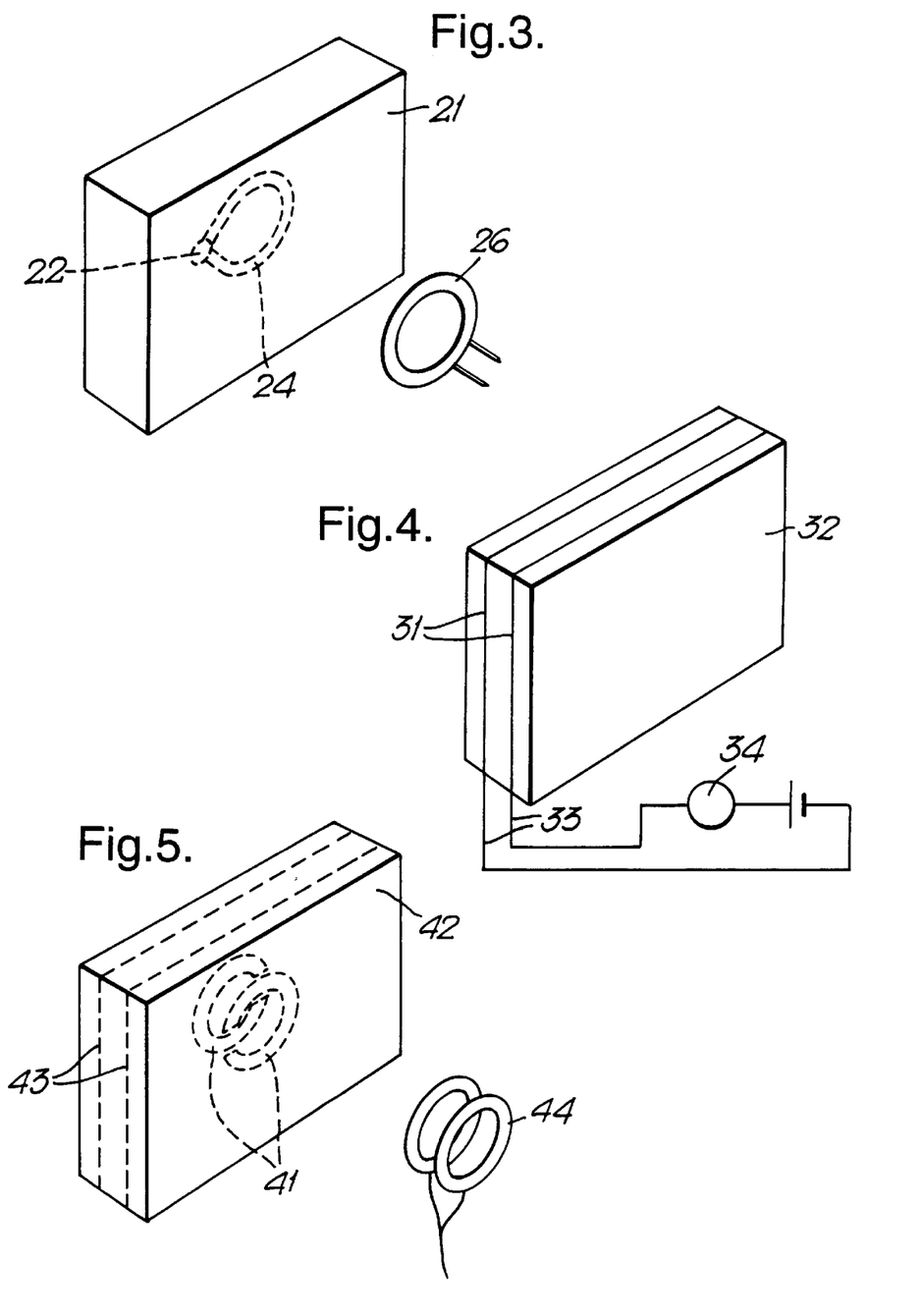
FIG. 3 illustrates a device provided with an inductive coupling formed using patterned cloth according to the invention.
FIGS. 4 and 5 illustrate degradation monitors formed within a laminated composite panel using patterned cloth according to the invention.
Figure 6:
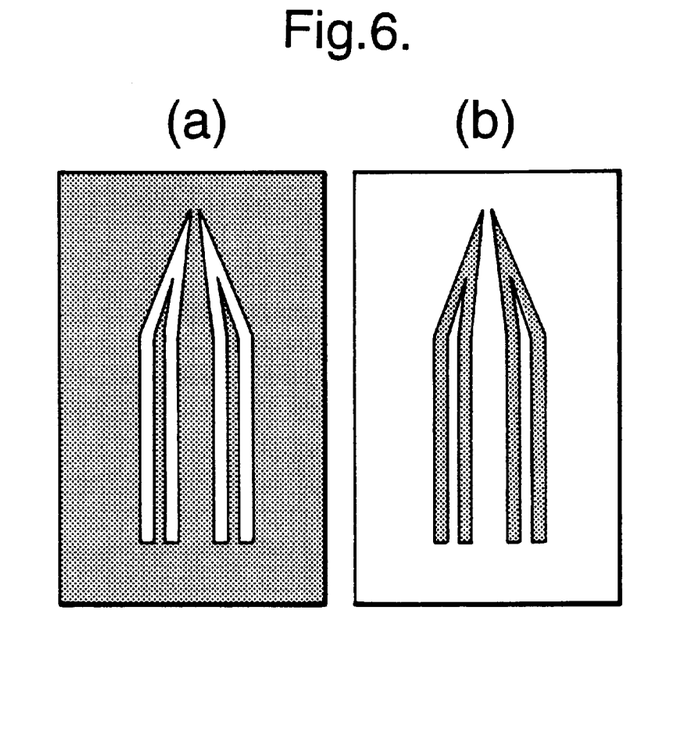
FIGS. 6 to 11 illustrate a laminate according to the invention used in a tuneable electromagnetic corner reflector.

FIG. 3 illustrates an alternative procedure for utilizing the patterning technique to effect an electrical connection to an embedded device. An inductive loop of conductive material 24 is fabricated onto a cloth and the cloth layer incorporated into a multilayer laminated composite panel 21 in like manner to the above. The device 22, which can be any suitable sensor, actuator or the like, is embedded in the panel 21 and electrically connected to the loop 24. The device can then be interrogated via inductive coupling with an external interrogator loop 26. The general principle will be familiar to those skilled in the art, but use of the patterned conducting cloth facilitates fabrication and incorporation into the laminate.

FIG. 4 illustrates use of the patterning principle to form a device itself within the laminate. Two conducting layer 31 with connecting paths are fabricated onto cloth as above and incorporated into a multilayer laminated composite panel 32 so as to lie parallel to each other, connection being effected via wires 33 to a monitor 34. The state of the resin matrix between the layers can be monitored, and corrosion, delamination, propagating cracks and the like detected, by using the monitor 34 to detect changes in the resistance or capacitance between the two embedded layers. Incorporation of a plurality of such devices throughout a structure would enable early warning to be given of both the existence and the location of effects.

Both the above principles are combined in the device illustrated in FIG. 5. The degradation monitor comprises two C-shaped conduction regions 41 embedded in the laminated composite 42 so as to lie opposite each other in parallel planes 43. This configuration allows direct interrogation of the degradation monitor via inductive coupling through an appropriately tuned external device 44, obviating the need for direct electrical connection.

FIGS. 6 to 11 relate to a particular embodiment of the invention comprising a tuneable electromagnetic corner reflector. It will be understood, however, that those features of the embodiment relating to the production of patterned cloth, external connection, and embedding of strain gauges will be of general applicability and not restricted to this particular application of the invention.

The base material for the fabrication of the patterned metallic cloths is a polyester woven cloth coated with a thin layer of copper. The copper is electrolessly deposited and hence each of the individual fibres is electrically connected to those adjoining it. This makes it ideal for its usual use as a electromagnetic shielding material but also allows the metallization to be patterned (not necessarily parallel to the weave of the cloth) into continuous tracks to produce material in accordance with the invention. Two fabrication methods have been developed. These are based on the selective etching and electroplating of areas defined by photolithographic techniques.

The initial steps in both the selective etching and electroplating methods are essentially the same, i.e. selected areas of the cloth must be coated with a material that will inhibit the action of the subsequent processes on that particular area.

The cloth is first stretched to produce a flat surface without creases or folds. In the initial studies this was achieved using a 50 cm square frame to which the cloth was attached by adhesive. The stretched cloth was then coated with a liquid photosensitive emulsion and allowed to dry for 24 hours to form an impervious layer over the cloth. The emulsion can however be patterned by selective exposure with ultra-violet light and development in an alkaline solution. In this example the emulsion is positive working, that is areas which are exposed are removed, but negative working resists are readily available and their use will be familiar. Positive resist was chosen due to its ease of application and processing and improved resolution compared to negative equivalents.

The conductor pattern required on the cloth is generated in a CAD package. The pattern is then transferred to a UV opaque emulsion on an ultra-violet transparent film. This transparency acts as the photomask for selective exposure of the pattern into the photosensitive emulsion on the copper coated cloth.

The photomask is then placed in intimate contact with the surface of the cloth emulsion and exposed with ultra-violet light. This is a similar process to that used in microelectronics industry although the tolerances and dimensions in this case allow the use of a light box rather than a high precision mask aligner. The cloth is then washed with an alkaline solution to remove the areas exposed to the UV and hence to uncover the underlying copper. The minimum feature size that could be defined using this particular equipment is approximately 250 $\mu$m. The feature size will be limited by both the exposure equipment, emulsion uniformity/sensitivity and the weave of the cloth substrate.

The first of the two alternative techniques used to produce the patterned cloths involves the selective electroplating of these exposed regions using the electroless copper as a plating bridge. The patterned cloth is simply used as the anode in a standard electrodeposition arrangement using a acidified copper sulphate solution (100 gm/litre) and a sacrificial copper cathode. A plating current of approximately 40 mA per mm$^2$ of linear cloth area is used. This is a slightly higher current density than normally used for plating flat surfaces due mainly to the additional area contributed by the cylindrical woven strands. The copper is plated to a thickness of approximately 100 $\mu$m. After plating the photosensitive emulsion was removed from the cloth followed by a thorough rinse in distilled water to remove any residues.

The cloth is then placed in a weak solution of ammonium peroxodisulphate. This solution slowly etches copper from the whole area of the cloth. The thinner unplated areas are completely removed within approximately two minutes leaving metallization present only in the isolated patterned areas of thicker electoplated copper.

The second technique relies solely on etching of the areas of copper unprotected by the patterned photosensitive emulsion. After patterning, the cloth is simply placed in the copper etchant described above until the exposed areas of copper are removed. The emulsion can then be removed to again leave the patterned copper.

The essential difference between the two techniques is that in the electroplated case the holes in the resist take the shape of the copper tracks and in the etched case the emulsion left after patterning takes the path of the tracks. This can be best shown through consideration of the relevant photomasks shown in FIG. 6. Both techniques produced the desired results, i.e. a patterned cloth, but each has its relative advantages and disadvantages.

The electroplated cloth is perhaps the more reliable since it enhances the connection between adjacent woven strands through the formation of plated bridges. These bridges ensure the production of a conducting track and their low resistance means they can handle a larger electrical current flow. The thickened copper does however introduce a larger interlaminar defect into the composite.

The etched cloth has a minimal thickness of copper and hence has a limited affect on the mechanical properties when embedded in a composite material. The reliance solely upon the electroless copper to produce the electrical path through the cloth does however mean that some discontinuities can occur, especially in the thinner track widths (<300 $\mu$m). These can be catered for by building in some redundancy in the circuit design. In the fabrication of the etched cloths great care must be taken to fully expose and to remove all of the emulsion in the regions between the tracks. Failure to do this can produce short circuits between separate devices.

As described earlier the conventional technique for taking electrical connections from an active device embedded in a composite panel is to feed a wire from between two of the laminates to the edge of the material. The inclusion of a patterned cloth carrying the equivalent of a printed circuit equivalent within the composite means the tracks can be accurately terminated, in an ordered fashion, at a predetermined position within the material. This permits the use of a more controlled and predictable connection technology.

When embedding the cloth substrate its position in the laminate is noted with reference to a point on the panel. If the panel is thin or is made from an optically transparent resin system the track terminations can be easily located by placing the panel in front of a strong light source. If the panel is optically opaque the terminations can be located by placing a template, aligned in the same position as the cloth in the panel, over the external surface of the panel.

Figure 7:
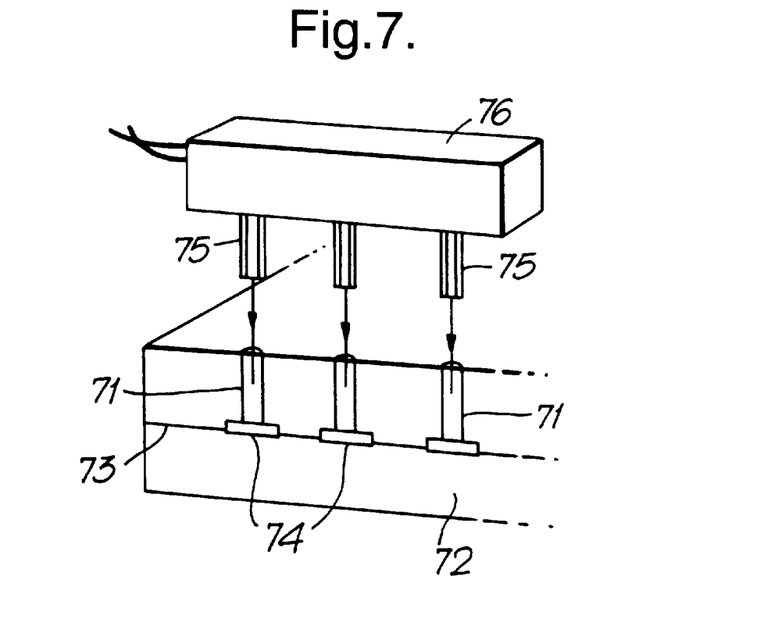

An example of a suitable connection is illustrated in FIG. 7. Once the track terminations are located small diameter holes (<500 $\mu$m) 71 are drilled through the front face of the laminate 72 to the depth of the cloth 73 at each point where a connection is required to a conducting track 74. The use of the plated cloths helps in this procedure since metallic particles can be seen in the swarf when the copper track is reached.

Electrical connection may be made by placing a small amount of conductive epoxy into the hole and inserting a thick wire. The panel may then be placed in a low temperature oven to cure the epoxy and produce the electrical contact. This procedure is greatly enhanced if the track separation is chosen to match the pitch of a standard multi-plug connector such as is illustrated in FIG. 7. The array of holes 71 are drilled to match with the connector pins 75 of the multi-plug connector 76. The connector can be given some additional support by securing it to the panel in a non-conducting epoxy.

The drilling of holes through a composite structure will locally degrade the mechanical performance. This disadvantage must however be considered in the context of the connections to a number of devices, spread over an area of perhaps 10 m², all being taken from a single connector which can be placed at a convenient position of minimum structural demands.

For example and testing purposes, two cloth circuits with connected to small (3×5 mm) polyimide film strain gauges were embedded in a composite sample fabricated from glass fibre cloth pre-impregnated with epoxy resin. The strain gauges were connected to the conducting tracks using composite epoxy. The cloths were arranged so that the strain gauges overlayed each other in the panel and external electrical connections made using the techniques described above. In this particular case, to minimise the mechanical effects on the relatively small substrate, only pins were placed in the drilled holes rather than full multi-pin connectors. A third external strain gauge was attached, over the embedded gauges, onto the surface of the composite.

Figure 8:
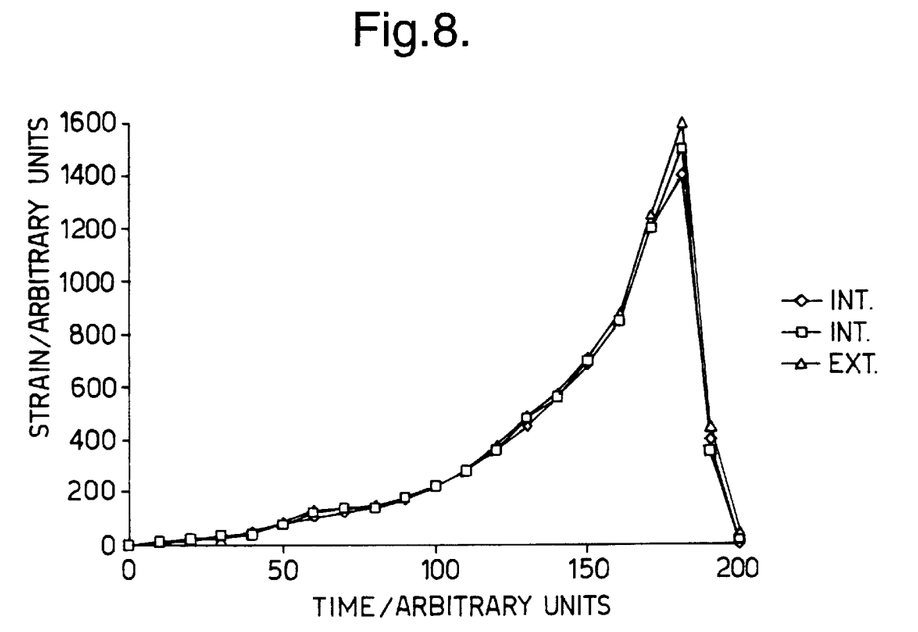

The test sample was then placed in a mechanical test rig and the outputs from each of the strain gauges monitored as varying strain levels were applied. The outputs from each of the strain gauges are shown in FIG. 8.

It can be seen that each of the strain gauges give comparable measurements. This indicates that valid results can be obtained from strain gauges embedded in a composite using the metallised cloths.

Figure 9:
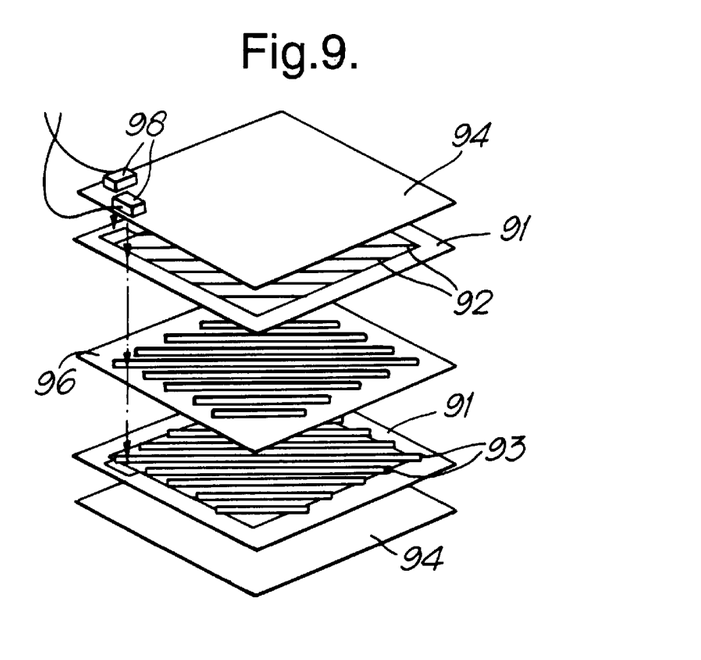

A further example of the invention is illustrated in FIG. 9, in which a 250×250 mm plate containing a number of separate piezoelectric elements is shown. The piezoelectric elements 93 are made from PZT5H which is a standard piezoelectric ceramic with plain electrodes. Each of the elements was 100×5×0.25 mm. Two metallised cloths 91 were prepared with a number of tacks 92, connected in parallel, running across the diagonal of a square of side 200 mm. These cloths were used to supply high voltages to the PZT.

The cloths 91 were embedded in a panel constructed from pre-impregnated glass fibre material 94, 96 and provided with copper conducting tracks 92 as described. The PZT elements 93 were attached to the copper tracks using a continuous bondline of conductive epoxy. In previous studies this method of attachment has been shown to produce the greatest deflections. The pre-impregnated laminate 96 that lays between the two cloths was cut so that it fitted around the PZT elements. This layer reduces the possibility of short circuits or high voltage breakdown between the powered cloths. Electrical connections were made using a simple two pin connector 98 to each of the cloth layers in similar fashion to the connector illustrated in FIG. 7.

The use of the printed cloths in this embodiment has considerable simplified the construction procedures used previously. The example given is a simple illustration of the use of the conductive patterned cloth. It can be seen that the technology could more fully be exploited by construction of a similar panel using interdigitated PZT (to increase available strain) together with integrated strain gauge monitoring. The use of interdigitated PZT entails a doubling in the number of electrodes and hence a significant increase in the complexity of the actuated plate. Using conventional techniques this would present a challenging fabrication exercise, however using the patterned cloths only a simple change to the pattern design is required.

Figure 10:
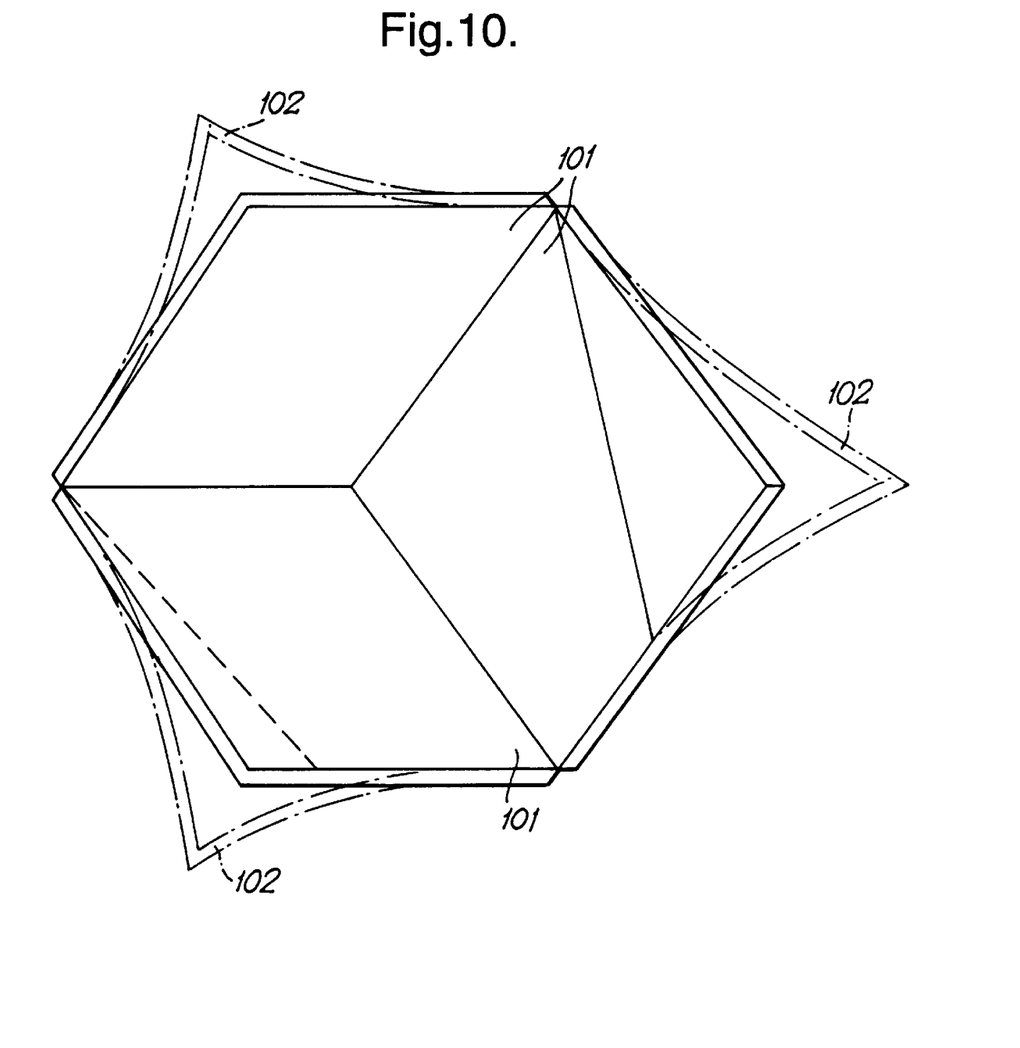

FIG. 10 illustrates a trihedral corner reflector comprising three movable plates 101 of glass reinforced polymer composite with integral PZT piezoelectric actuators. The reflector is in the orthogonal position for maximum radar cross-section. The broken lines 102 illustrate the positions the plates 101 will occupy following actuation of the PZT actuators to cause bending of the active plates to a null-reflecting configuration. It can be noted that in the latter configuration the plates are no longer planar as a consequence of the deformation characteristics of the actuator material, which produces movement in bending and extension, but this is not found to have a significant adverse effect on the operation of the reflector according to the principles outlined above.

A particular application of the invention is in the field of runway identification systems to aid landing of aircraft in poor visibility. During recent years there have been many incidents of commercial airliners becoming disorientated when approaching an airfield through the use of their Instrument Landing System (ILS) and attempting to land on taxiways and even perimeter roads. This is a particular problem at certain modern high capacity airports which operate with multiple parallel runways. This has led to a desire for the development of active or passive millimetric radar system for civil aircraft known as Enhanced Vision systems (EVS). Such equipment would use either 35 or 94 GHz frequencies and a Head Up Display (HUD) to create a visual image of the airport and runway. The pilot would then be able to fly the aircraft down the approach glide path through extremely poor weather conditions without having to rely on the ILS.

Figure 11:
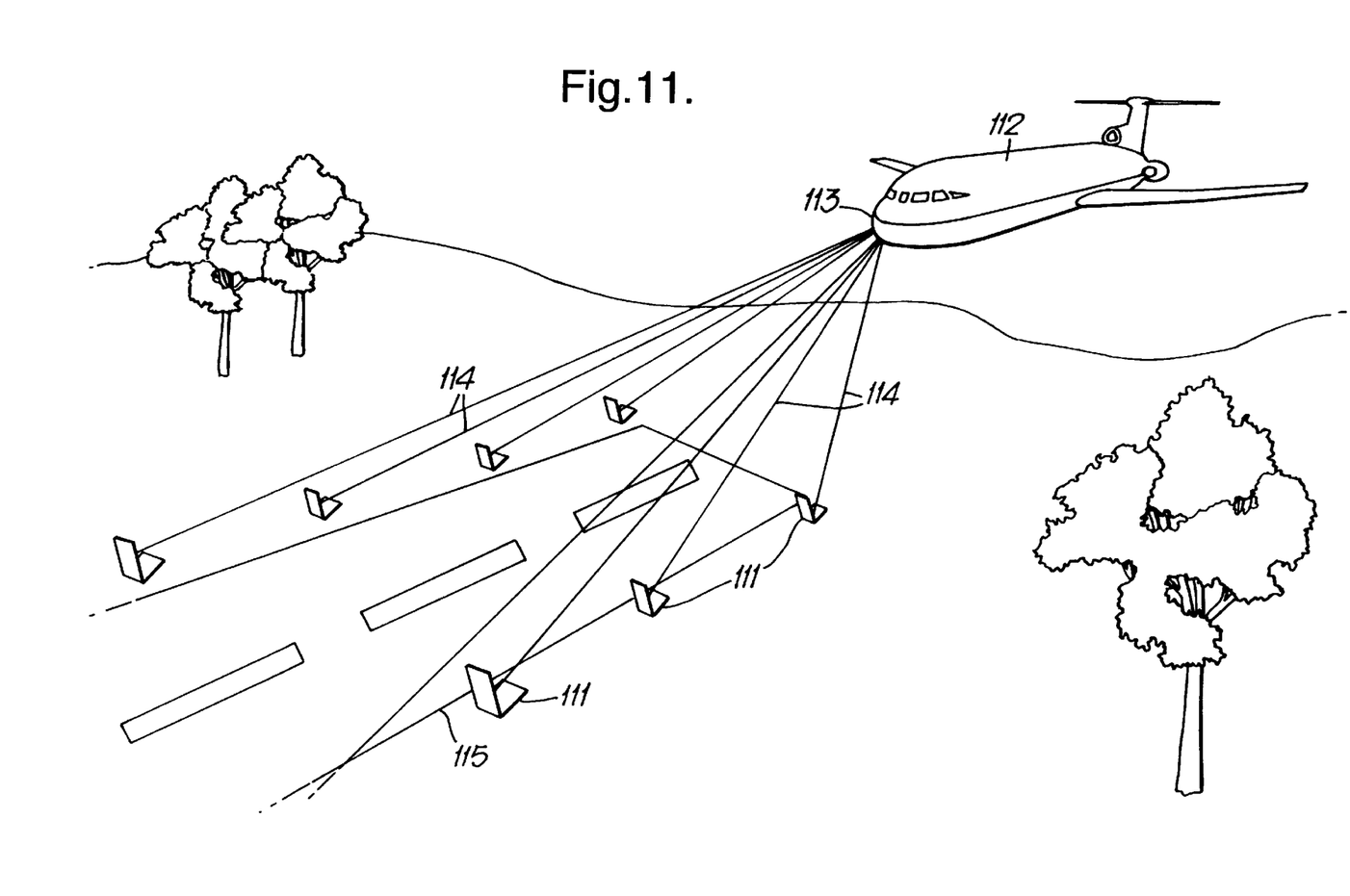

A series of dihedral corner reflectors 111 are positioned along the length of a runway 15 (FIG. 11). The system could equally incorporate trihedral reflectors. With the plates of the corner reflector adjusted to an orthogonal position the reflector exhibits a high radar cross section. An incoming aircraft 112 with a radar transceiver in the nose 113 receives strongly reflected signals returned along the paths 114 producing an enhanced image suitable for producing the head up displays discussed above. Operation of the actuation mechanism to produce divergence of the plates allows them to be switched on or off and even adjusted to counter any variation in approach angle of the incoming aircraft. Clearly it would be an advantage if only the operational runway was identified as too much information may make interpretation of the image difficult. This is particularly the case at high volume airports with more than one parallel runway operating sequentially. Use of the invention in a runway identification system as described allows such selective identification with passive reflectors by allowing selective actuation of the reflectors.

At the millimetric wavelengths under consideration for civil aircraft EVS systems manageable deflections achieve the first null without requiring excessively sized plates. For example with a 100 mm dihedral the reflection profile will reduce to a first null at a deflection of 3.45° at 35 GHz and at a deflection of 1.30° at 94 GHz. A further example of a use for the switchable corner reflector is to provide a passive digital RF signalling device. The reflector is switched between its orthogonal "on" configuration and its "off" configuration in a predetermined pattern in accordance with a suitable message relaying system (such as Morse code). The message is thus visible only to a remote observer who interrogates the reflector with a radar signal of the appropriate frequency, but is not transmitted as such.

Other uses of the invention will suggest themselves to those skilled in the art of radar signalling and reflection.

We claim:

1. A laminated composite material comprising a plurality of cloth layers having deposited thereon a patterned layer of electrical conductor, the electrical conductor being deposited to such a thickness that individual fibers of the cloth are coated but that permeation of the cloth by resin remains possible in the conducting regions, the cloth being impregnated with an uncured, curable polymeric composite matrix material, the laminated composite further comprising at least one embedded electronic device electrically connected to the patterned layer such that the patterned layer effects external electrical connection to the embedded device.

2. A laminated composite material according to claim 1 comprising a plurality of embedded electronic devices electrically connected to the patterned layer such that the patterned layer effects internal connection between the embedded devices.

3. A laminated composite material according to claim 1 wherein at least one embedded device is a sensor.

4. A laminated composite material according to claim 1 wherein at least one embedded device is an actuator.

5. A laminated composite material according to claim 1 wherein at least some of the conducting paths are configured to form one or more resonant structures for effecting remote connection between an embedded device and a tuned system external to the laminate.

6. A corner reflector comprising at least two flat reflector plates comprising laminated composite material according to claim 7 wherein the at least one actuator comprises means capable of varying the internal angle between the reflector plates between a first angle at which the reflectance of electromagnetic radiation is substantially at a peak and a second angle at which the reflectance of electromagnetic radiation is substantially zero.

7. A corner reflector according to claim 6 wherein the first angle is substantially 90°.

8. A corner reflector according to claim 7 wherein the second angle is at a deviation from 90° which corresponds to the first fix in reflectance.

9. A corner reflector according to claim 6 wherein the at least one actuator comprises a piezoelectric material embedded within the laminated composite material.

10. A method of manufacture of a cloth layer according to claim 1 comprising screen printing with conducting inks to produce a layer of electrical conductor.

11. A method of manufacture of a cloth layer according to claim 1 comprising photolithography to produce a layer of electrical conductor.

12. A method according to claim 11 comprising the steps of: coating a premetallized cloth with a photoresist; exposing the photoresist in the desired pattern and etching to expose the patterned areas; thickening and the metallization in the patterned areas; stripping clear the remaining photoresist; giving the cloth a further etchant sufficient to remove the metallization in the unpatterned areas leaving a patterned conducting layer corresponding to the thickened areas.

\* \* \* \* \*